United States Patent
Ueltzhoeffer et al.

(10) Patent No.: US 10,911,043 B2
(45) Date of Patent: Feb. 2, 2021

(54) METHOD FOR SWITCHING OVER A SEMICONDUCTOR SWITCH

(71) Applicant: Robert Bosch GmbH, Stuttgart (DE)

(72) Inventors: Frank Ueltzhoeffer, Stuttgart (DE); Daniel Marquardt, Gerlingen (DE); Bernd Wichert, Kernen (DE); Ralf Henne, Sachsenheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/492,700

(22) PCT Filed: Jan. 31, 2018

(86) PCT No.: PCT/EP2018/052354
§ 371 (c)(1),
(2) Date: Sep. 10, 2019

(87) PCT Pub. No.: WO2018/166697
PCT Pub. Date: Sep. 20, 2018

(65) Prior Publication Data
US 2020/0052691 A1    Feb. 13, 2020

(30) Foreign Application Priority Data
Mar. 16, 2017 (DE) .................. 10 2017 204 418

(51) Int. Cl.
*H03K 17/14* (2006.01)
*H03K 17/284* (2006.01)

(52) U.S. Cl.
CPC ......... *H03K 17/284* (2013.01); *H03K 17/145* (2013.01)

(58) Field of Classification Search
CPC ...... H03K 17/14; H03K 17/145; H03K 17/28; H03K 17/284
(Continued)

(56) References Cited

U.S. PATENT DOCUMENTS 6,294,954 B1 * 9/2001 Melanson ................ H03F 1/32
326/83
2012/0139567 A1 6/2012 Yamanobe
(Continued)

FOREIGN PATENT DOCUMENTS

DE        10211543 A1    10/2003
DE    102006024938 B3    8/2007
(Continued)

OTHER PUBLICATIONS

International Search Report for PCT/EP2018/052354, dated Apr. 23, 2018.

*Primary Examiner* — William Hernandez
(74) *Attorney, Agent, or Firm* — Norton Rose Fulbright US LLP; Gerard Messina

(57) ABSTRACT

A device and a method for switching over a semiconductor switch with a switching signal acting on a control connection of the semiconductor switch, the switching signal being switched over as a response to registering a switchover of an activation signal; a down time being ascertained between the start of the switchover of the switching signal and the switchover of the semiconductor switch; the switchover of the semiconductor switch being delayed by a waiting period, for example by delaying the output of the switching signal and/or changing the signal level, so that an actual switching time, corresponding to a setpoint switching time, between the registration of the switchover of the activation signal and the switchover of the semiconductor switch is obtained.

13 Claims, 1 Drawing Sheet

(58) Field of Classification Search
USPC .................................................. 327/108, 109
See application file for complete search history.

(56) References Cited

U.S. PATENT DOCUMENTS

| | | | | |
|---|---|---|---|---|
| 2013/0193938 A1* | 8/2013 | Shook | ................... | H03K 3/037 |
| | | | | 323/271 |
| 2016/0126822 A1* | 5/2016 | Lyle | ................... | H03K 17/28 |
| | | | | 363/123 |
| 2016/0380536 A1* | 12/2016 | Rowald | ................ | H03K 17/162 |
| | | | | 323/271 |

FOREIGN PATENT DOCUMENTS

| | | |
|---|---|---|
| DE | 102008023499 A1 | 11/2009 |
| EP | 3109990 A2 | 12/2016 |
| WO | 2015001311 A1 | 8/2007 |
| WO | 2009017704 A1 | 11/2009 |

\* cited by examiner

METHOD FOR SWITCHING OVER A SEMICONDUCTOR SWITCH

FIELD OF THE INVENTION

The present invention relates to a method for switching over a semiconductor switch as well as a processing unit for carrying out said method and a transistor driver circuit.

BACKGROUND INFORMATION

It is believed to be customary to use semiconductor switches or field effect transistors, in particular MOSFETs, as switches in electronic circuits. The switching takes place by charging a control terminal (gate) with the aid of a switching signal (voltage or current) provided by a so-called transistor driver circuit, the exact switchover point in time depending on the external wiring and the MOSFET properties, however. These properties are specific to each MOSFET type and vary within the manufacturing tolerance and across temperature. However, in the case of certain applications it is desirable to precisely know or predefine the switchover point in time.

SUMMARY OF THE INVENTION

According to the present invention, a method for switching over a semiconductor switch as well as a processing unit for carrying out same and a transistor driver circuit having the features of the disclosure herein are provided. Advantageous embodiments are the subject matter of the further descriptions herein as well as of the following description.

The present invention is based on the idea for obtaining a desired (and in particular reproducible) setpoint switching time between a switchover of an activation signal (for example from a superordinate control) and the actual switchover of the semiconductor switch by ascertaining a down time between the start of the switchover of the switching signal at the control terminal of the semiconductor switch and the actual switchover of the semiconductor switch, which may be in the transistor driver circuit, and by delaying the switchover of the semiconductor switch by a waiting period, so that an actual switching time, which corresponds to the setpoint switching time, is obtained between the registration of the switchover of the activation signal and the switchover of the semiconductor switch.

The waiting time is adapted in particular for a subsequent switching operation. In this way, following each switching operation the actual switching time may be tracked as a sum of the inherent down time and waiting time in such a way that it may correspond to the desired setpoint switching time for the subsequent switching operation. Changes in the inherent down time, which occurred in the meantime, may then be readjusted for the next switching operation, etc.

The switchover of the semiconductor switch may in particular be delayed by delaying the start of the switchover of the switching signal and/or by reducing the signal level of the switching signal. In other words, a variable delay (waiting period) of the switching signal output is introduced in a transistor driver circuit according to a first variant. By changing the variable delay, the actual delay may be compensated for, so that the sum of the variable and the actual delay is constant. According to a second variant, the switchover point in time is changed by changing the switching signal, in particular by changing the current for charging/discharging the gate. If the current or the voltage of the switching signal is reduced, it takes more time until the switchover and vice versa.

The present invention introduces a controlled and thus very constant delay period of the switching operation of a semiconductor switch. The influence of manufacturing tolerances, component properties, and the temperature is corrected. In this way, the delay period may be compensated for in a superordinate system application. The accuracy is improved.

A transistor driver circuit according to the present invention includes inputs for receiving an activation signal and for setting a delay value and outputs for outputting a switching signal and a down time value, a measuring element for measuring the down time value as the time delay between a start of the switchover of the switching signal and a switchover of a connected semiconductor switch and a delay element for delaying a switchover of the semiconductor switch by the delay value. The transistor driver circuit is in particular configured as an integrated circuit (IC), in particular as an application-specific integrated circuit (ASIC). An integrated circuit may include multiple transistor drivers for electively activating multiple connected transistors.

The present invention is suitable for switching over the semiconductor switch from a non-conductive state to a conductive state and vice versa. The associated switching signal may be switched over for switching over the semiconductor switch from the non-conductive state to the conductive state from any arbitrary first level to any arbitrary second level, for example from "OFF" to "ON" or vice versa depending on the configuration. Finally, the switchover of the switching signal may also take place as a response to the switchover of the activation signal from any arbitrary third level to any arbitrary fourth level, for example from "OFF" to "ON" or vice versa. In other words, all permutations of switching over the semiconductor switch, switching over the switching signal, and switching over the activation signal are encompassed.

A processing unit according to the present invention, e.g., a control unit of a motor vehicle, is configured to carry out a method according to the present invention, in particular from a programming point of view.

It is also advantageous to implement the method in the form of a computer program, since this is particularly cost-effective, in particular when an executing control unit is used for other tasks and is thus present anyway. Suitable data carriers for providing the computer program are, in particular, magnetic, optical, and electric memories such as hard drives, flash memories, EEPROMs, DVDs, and many others. It is also possible to download a program via computer networks (Internet, Intranet, etc.).

Further advantages and embodiments of the present invention result from the description and the appended drawing.

The present invention is schematically illustrated in the drawing on the basis of an exemplary embodiment and is described below with reference to the drawing.

DETAILED DESCRIPTION

Figure 1:
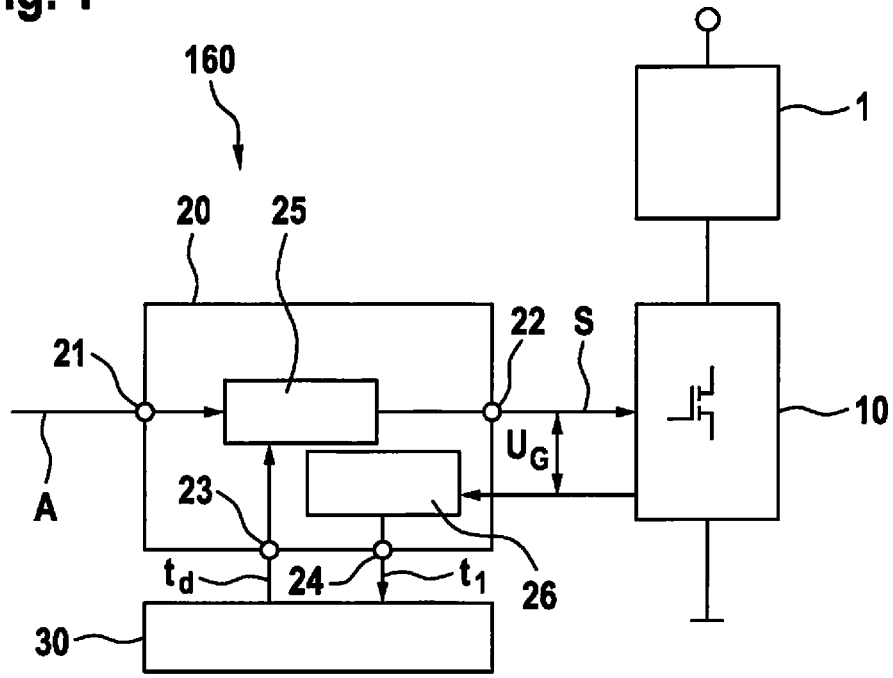
FIG. 1 shows one specific embodiment of a circuit configuration according to the present invention, including a field effect transistor and a transistor driver circuit.

One specific embodiment of a circuit configuration according to the present invention, including a transistor driver circuit 20, a semiconductor switch 10, which is activated by the latter and configured as a MOSFET in the present case, and a processing unit 30, is schematically illustrated in a block diagram and identified by reference numeral 160 in FIG. 1. A consumer 1, for example an actuator or a load, for example in a vehicle, is switched with the aid of semiconductor switch 10, for example.

Transistor driver circuit 20 includes an input 21 for receiving an activation signal A and an output 22 for outputting a switching signal S. Transistor driver circuit 20 further includes an input 23 for receiving a delay value $t_d$ and an output 24 for outputting a down time value $t_1$. In addition, transistor driver circuit 20 includes a delay element 25 for delaying the switchover of semiconductor switch 10, in this case by delaying the start of the output of switching signal S by delay value $t_d$, and a measuring element 26 for measuring down time value $t_1$ as the time delay between a start of the output of switching signal S and a switchover of semiconductor switch 10 (see also FIG. 2). Alternatively or additionally, the actual switching time $t_v$ may also be varied by varying the signal level of the switching signal. In this case, switching signal S is not delayed by $t_d$, but its level is changed. In other words, $t_d$ becomes zero, but $t_1$ is changed.

Transistor driver circuit 20 is configured as an IC or ASIC, for example, and includes multiple of the depicted transistor drivers for electively activating multiple connected transistors.

Figure 2:
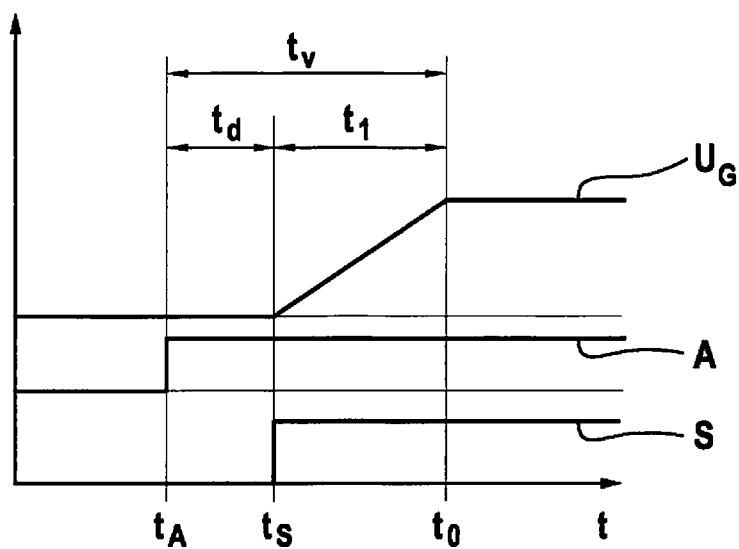
FIG. 2 shows signal sequences in the case of the switchover of a field effect transistor when using a method according to the present invention.

With reference to FIG. 2, the switchover of semiconductor switch 10 takes place by charging the gate or a potentially present external gate wiring to a sufficiently high gate source voltage $U_G$. Time period $t_1$ between start $t_S$ of the output of switching signal S and the actual switchover of MOSFET 10 at point in time $t_0$ is non-deterministic, but it is ascertained or measured with the aid of measuring element 26. Time period $t_1$ is in particular a function of the signal level of switching signal S.

In the case of conventional transistor driver circuits, a variable or predefinable time delay between the reception of activation signal A at point in time $t_A$ and the output of switching signal S at point in time $t_S$ and also a variation of the signal level are not possible. Within the scope of the present invention, however, transistor driver circuit 20 is now configured to receive delay value $t_d$ at input 23 and to make available with the aid of delay element 25 a corresponding time delay between the reception of activation signal A at point in time $t_A$ and the output of switching signal S at point in time $t_S$ and/or to correspondingly change the signal level of switching signal S.

Consequently, a desired (and in particular reproducible) actual switching time $t_v$ between the reception of the activation signal at point in time $t_A$ and the switching of the semiconductor switch at point in time $t_0$ is obtained that may be controlled to a setpoint switching time in particular with the aid of processing unit 30, which is operated as the controller. Processing unit 30 may be an integral part of a superordinate control unit, for example, that carries out functions, in the case of which transistors are used for switching. For example, engine control units for controlling injection processes are to be named here.

Although the present invention is described in the figure in the context of charging the gate, it also applies mutatis mutandis for discharging. Down times may be ascertained for both processes and switching times may be correspondingly controlled by varying the delay periods or signal levels. The same also applies to the relation between the switching signal and the conductivity state of the semiconductor switch as well as between the activation signal and the switching signal. In this case, it is also possible that the semiconductor switch is switched on as a response to the switching signal being switched off, for example, or that the switching signal is output as a response to the activation signal being switched off, for example.

What is claimed is:

1. A method for switching over a semiconductor switch with a switching signal, the method comprising:
   providing the switching signal to act on a control connection of the semiconductor switch, wherein the switching signal is switched over as a response to registering a switchover of an activation signal;
   ascertaining a down time between a start of the switchover of the switching signal and the switchover of the semiconductor switch, wherein the switchover of the semiconductor switch is delayed by a waiting period, so that an actual switching time, corresponding to a setpoint switching time, between the registration of the switchover of the activation signal and the switchover of the semiconductor switch is obtained,
   wherein the switchover of the semiconductor switch is delayed by reducing a signal level of the switching signal.

2. The method of claim 1, wherein the switchover of the semiconductor switch is delayed by delaying the start of the switchover of the switching signal.

3. The method of claim 1, wherein the semiconductor switch is switched over from a non-conductive state to a conductive state or vice versa.

4. The method of claim 1, wherein the switching signal is switched over from a first level to a second level.

5. The method of claim 1, wherein the activation signal is switched over from a third level to a fourth level.

6. The method of claim 1, wherein a field effect transistor is switched over as the semiconductor switch.

7. The method of claim 1, wherein a consumer in a vehicle is switched with the semiconductor switch.

8. A processing device, comprising:
   a processing unit configured for switching over a semiconductor switch with a switching signal, by performing the following:
      providing the switching signal to act on a control connection of the semiconductor switch, wherein the switching signal is switched over as a response to registering a switchover of an activation signal;
      ascertaining a down time between a start of the switchover of the switching signal and the switchover of the semiconductor switch, wherein the switchover of the semiconductor switch is delayed by a waiting period, so that an actual switching time, corresponding to a setpoint switching time, between the registration of the switchover of the activation signal and the switchover of the semiconductor switch is obtained,
   wherein the switchover of the semiconductor switch is delayed by reducing a signal level of the switching signal.

9. A transistor driver circuit, comprising:
   inputs for receiving an activation signal and for setting a delay value;
   outputs for outputting a switching signal and a down time value;

a measuring element for ascertaining the down time value as the time delay between a start of the switchover of the switching signal and a switchover of a connected semiconductor switch; and a delay element for delaying the switchover of the connected semiconductor switch by the delay value, wherein the switchover of the semiconductor switch is delayed by reducing a signal level of the switching signal.

10. The transistor driver circuit of claim 9, wherein the delay element is configured to delay the start of a switchover of the switching signal and/or to change the signal level of the switching signal.

11. The transistor driver circuit of claim 9, wherein the driver circuit includes an integrated circuit and is configured for electively activating multiple connected semiconductor switches.

12. A circuit configuration, comprising:
a transistor driver circuit; and
at least one semiconductor switch connected to the transistor driver circuit;
wherein the transistor driver circuit includes:
inputs for receiving an activation signal and for setting a delay value;
outputs for outputting a switching signal and a down time value;
a measuring element for ascertaining the down time value as the time delay between a start of the switchover of the switching signal and a switchover of the at least one connected semiconductor switch; and
a delay element for delaying the switchover of the at least one connected semiconductor switch by the delay value,
wherein the switchover of the semiconductor switch is delayed by reducing a signal level of the switching signal.

13. The circuit configuration of claim 12, further comprising:
a processing unit configured for switching over the at least one semiconductor switch with the switching signal, by performing the following:
providing the switching signal to act on a control connection of the at least one semiconductor switch, wherein the switching signal is switched over as a response to registering a switchover of the activation signal;
ascertaining the down time between the start of the switchover of the switching signal and the switchover of the at least one semiconductor switch, wherein the switchover of the at least one semiconductor switch is delayed by a waiting period, so that an actual switching time, corresponding to a setpoint switching time, between the registration of the switchover of the activation signal and the switchover of the at least one semiconductor switch is obtained.

* * * * *